United States Patent [19]

Kashiyama et al.

[11] Patent Number: 5,628,000
[45] Date of Patent: May 6, 1997

[54] CLOCK DISTRIBUTING LOGIC AND CLOCK SKEW CONTROL DESIGN METHOD FOR DESIGNING CLOCK DISTRIBUTING LOGIC

[75] Inventors: Masamori Kashiyama, Isehara; Teruhisa Shimizu, Oume, both of Japan

[73] Assignee: Hitachi, Ltd., Tokyo, Japan

[21] Appl. No.: 405,759

[22] Filed: Mar. 20, 1995

[30] Foreign Application Priority Data

Mar. 18, 1994 [JP] Japan .................... 6-048338

[51] Int. Cl.[6] .................................. G06F 1/04
[52] U.S. Cl. ........................... 395/558; 327/261
[58] Field of Search ..................... 395/550, 552, 395/558; 307/409; 327/261

[56] References Cited

U.S. PATENT DOCUMENTS

| | | | |
|---|---|---|---|
| 5,122,679 | 6/1992 | Ishii et al. | 327/147 |
| 5,164,619 | 11/1992 | Luebs | 327/297 |
| 5,235,521 | 8/1993 | Johnson et al. | 364/489 |
| 5,258,660 | 11/1993 | Nelson et al. | 327/261 X |
| 5,268,656 | 12/1993 | Muscavage | 331/45 |
| 5,272,390 | 12/1993 | Watson, Jr. et al. | 327/261 X |
| 5,298,866 | 3/1994 | Kaplinsky | 327/261 |
| 5,369,640 | 11/1994 | Watson et al. | 307/409 X |

OTHER PUBLICATIONS

Exact Zero Skew, Ren–Song Tsay, IBM, T.J. Watson Research Center IEEE, 1991, pp. 336–339.

*Primary Examiner*—Thomas M. Heckler
*Attorney, Agent, or Firm*—Antonelli, Terry, Stout & Kraus, LLP

[57] ABSTRACT

A clock distributing logic for distributing a clock signal in a circuit and reducing clock skew which occurs during the distributing of the clock signal in the circuit and a method for designing the same. The clock distributing logic includes at least two stages of clock amplifying gates for distributing the clock signal to source and sink sides of the circuit. Each of the at least two stages are successively connected to each other. Further, each of the at least two stages except a last stage includes clock amplifying gates of a same size providing a same driving ability. The last stage of clock amplifying gates includes clock amplifying gates of different sizes providing different driving abilities. The size of each clock amplifying gate of the last stage of clock amplifying gates is set to make the delay in distributing the clock signal in the circuit coincide with a desired clock signal distributing cycle.

24 Claims, 4 Drawing Sheets

F I G. 7
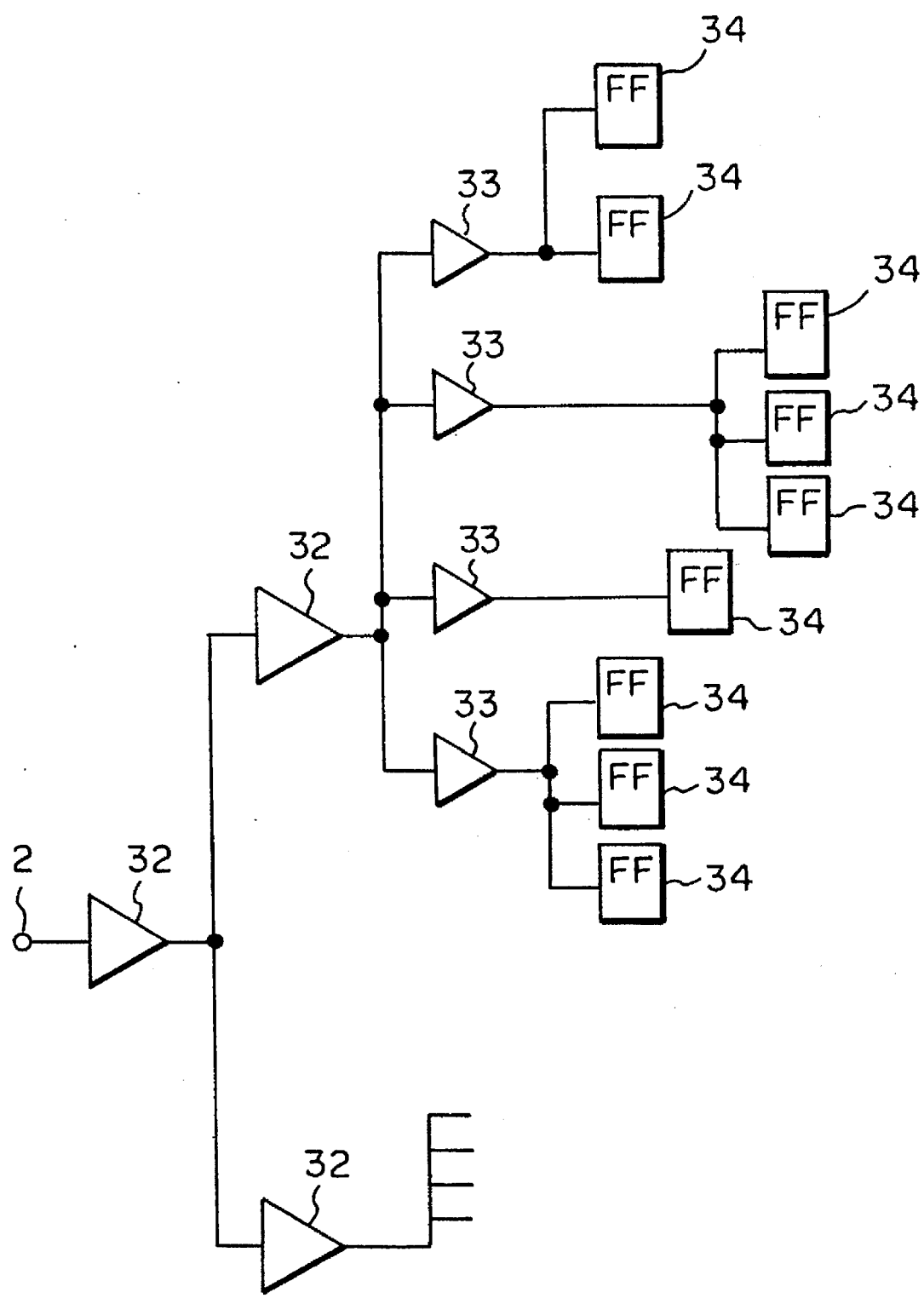

CLOCK DISTRIBUTING LOGIC AND CLOCK SKEW CONTROL DESIGN METHOD FOR DESIGNING CLOCK DISTRIBUTING LOGIC

BACKGROUND OF THE INVENTION

The present invention relates to clock distributing logic for reducing clock skew during the distribution of a clock signal in a circuit. More particularly, the present invention relates to a clock skew control design method for designing clock distributing logic in a manner to reduce clock skew in a circuit by varying the driving ability of last-stage clock amplifying gates included in the clock distributing logic.

Generally, the increase of clock skew in an LSI circuit or a microprocessor increases data transfer time (path delay) necessary to transfer data from a flip-flop on the side of a source to a flip-flop on the side of a sink in the LSI circuit or microprocessor.

Such a path delay is expressed by the following expression.

$$Tc = TgateD + TwireD + Tskew \qquad (1)$$

where Tc is a time necessary for data to be transferred from the flip-flop on side of the source to the flip-flop on the side of the sink, i.e., path delay, TgateD is a time necessary for data to pass a logic gate disposed between the flip-flop on the side of the source and the flip-flop on the side of the sink, i.e., gate delay, TwireD is a capacitive and resistive delay caused by a wiring line connecting the flip-flop on the side of the source through the logic gate to the flip-flop on the side of the sink, i.e., wire delay, and Tskew is clock skew.

Generally, the path delay Tc is equal to the operating frequency (machine cycle) of the LSI circuit or the microprocessor. Accordingly, the reduction of the path delay is an important problem in decreasing the length of the machine cycle. High-speed devices have been employed to reduce gate delay and low-resistance, low-capacitance wiring lines have been employed to reduce wiring delay.

However, the ratio of clock skew relative to the other causes of delay has increased as the length of the machine cycle has decreased by the employment of high-speed gates and high-speed wiring lines. In fact, the ratio of clock skew to the other causes of delay is nearly equal to 10% of the total delay. Therefore, the reduction of clock skew is one of the most important problems in enhancing machine cycle.

A generally known clock skew reducing method provides circuits, respectively connecting flip-flops to the clock input pin of a LSI circuit or microprocessor, with the same number of clock amplifying gates and respectively connects the flip-flops by using wiring lines having the same length to the clock input pin. Such connections using wiring lines having the same length cause the time necessary for transferring a clock signal from the clock input pin through the circuits to the flip-flops to coincide with a reference time. This method is not very effective with small scale circuits.

Another generally known clock skew reducing method calculates delays in transferring a clock signal from the clock input pin to the flip-flops and adjusts the lengths of wiring lines connecting the last clock amplifying gates to the corresponding flip-flops according to the amount of the delay necessary for transferring a clock signal from the clock input pin through the circuit to the flip-flops deviates from a reference time. According to this method adjusting the lengths of wiring lines effects wire delay (capacitive delay) in the circuit. Thus, the flip-flops are driven at the same time. This method, described in "Exact Zero Skew", IEEE International Conference on Computer-aided Design 1991, November 11–14, increases costs and requires extra processing steps to form the circuits.

The above-described clock skew reducing methods also suffer from disadvantages other than those described above. For example, the above-described clock skew reducing methods unnecessarily increase the number of clock wiring lines and require a relatively large number of clock amplifying gates. Further there are diminishing returns for using the above described clock skew reducing methods as the density of logic gates increase and as the performance of microprocessors and LSI circuits increase. Recently developed techniques for designing and fabricating semiconductor circuits and delay simulation have reduced clock skew remarkably.

However, significant fortification of LSI circuits and microprocessors with clock logic circuits, clock distributing amplifying gates and clock wiring lines included particularly in microprocessors to suppress clock skew has brought about problems including an increase in the quantity of hardware and an increase in the power consumption of such LSI circuits and microprocessors. These problems are significant even though such fortification of LSI circuits and microprocessors reduce clock skew nearly to null.

SUMMARY OF THE INVENTION

Accordingly, it is an object of the present invention to provide a clock skew control design method for designing clock distributing logic which reduces clock skew in LSI circuits or microprocessors.

Another object of the present invention is to provide clock distributing logic designed by the clock skew control design method that reduces clock skew in LSI circuits or microprocessors.

Yet another object of the present invention is to provide a clock skew control design method for reducing clock skew in LSI circuits or microprocessors during design of the circuits thereby greatly reducing the quantity of hardware such as clock amplifying gates and clock wiring lines required.

The present invention provides clock distributing logic that operates in synchronism with a clock signal and distributes a clock signal applied to a clock input pin of a LSI circuit or microprocessor to flip-flops in the LSI circuit or microprocessor in a manner that reduces clock skew. The clock distributing logic of the present invention distributes a clock signal to flip-flops in an LSI circuit or microprocessor from the clock input pin of the LSI circuit or microprocessor and reduces clock skew which occurs during the distributing of the clock signal so that a delay in the distributing of the clock signal coincides with a delay of a reference transfer cycle (machine cycle).

The clock distributing logic includes at least two stages of clock amplifying gates for distributing the clock signal to flip-flops on source and sink sides of the LSI circuit or microprocessor. Each of the at least two stages of clock amplifying gates are successively connected to each other. Further, each of the at least two stages of clock amplifying gates except a last stage of clock amplifying gates includes clock amplifying gates of a same size providing a same driving ability. The last stage of clock amplifying gates includes clock amplifying gates of different sizes, relative to the clock amplifying gates of prior stages, providing different driving abilities. The size of each clock amplifying gate of the last stage of clock amplifying gates is set to cause the delay in distributing the clock signal to a flip-flop connected to the clock amplifying gate in the LSI circuit to coincide with the delay in the reference clock signal distributing cycle.

The driving ability of a clock amplifying gate having source, drain and gate is changed by changing the width of the gate when the clock amplifying gate is a CMOS structure and by adjusting the last stage emitter follower current when the clock amplifying gate is an emitter coupled logic (ECL) structure.

The clock distributing logic of the present invention is designed using a clock skew control design method which designs clock distributing logic such that the clock distributing logic reduces clock skew in an LSI circuit or microprocessor by causing a delay in the clock distributing logic to coincide with a delay of a reference transfer cycle. The clock distributing logic is designed to operate in synchronism with a clock signal so as to distribute the clock signal applied to the clock input pin of the LSI circuit or microprocessor to flip-flops on source and sink sides of the LSI circuit or microprocessor.

In the clock skew control design method a delay which occurs during transfer of the clock signal from the clock input pin through the clock distributing logic to a flip-flop is simulated. From the simulation a source side clock delay representative of a delay which occurs during transfer of the clock signal from the clock input pin to the flip-flop on the source side of the LSI circuit or microprocessor is determined and a sink side clock delay representative of a delay which occurs during transfer of the clock signal from the clock input pin to the flip-flop on the sink side of the LSI circuit or microprocessor is determined. A path delay which occurs during transfer of the clock signal from the flip-flop on the source side of the LSI circuit or microprocessor to the flip-flop on the sink side of the LSI circuit or microprocessor is determined along with a total path delay which is the sum of a difference between the source side clock delay and the sink side clock delay and the path delay.

The clock skew control design method reduces clock skew via the clock distributing logic by changing the driving ability of each clock amplifying gate of a last stage of clock amplifying gates of the at least two stages of clock amplifying gates of the clock distributing logic based on the total path delay and the delay of the reference transfer cycle. By changing the driving ability of the last stage of clock amplifying gates the total path delay is made to coincide with the delay of the reference transfer cycle.

The path delay is concerned with the delay in transferring data from the flip-flop on the source side to the flip-flop on the sink side of the LSI circuit or microprocessor. Thus, the path delay would include delays such as the gate delay and output delay of the flip-flop on the source side, the gate delays and output delays of the logic gates of the LSI circuit or microprocessor and the delay caused by resistance, capacitance and noise in the wiring lines interconnecting the logic gates of the LSI circuit or microprocessor.

The total path delay, is represented by obtaining a sum of the difference between the simulated clock delay in transferring the clock signal to the flip-flop on the source side of the LSI circuit or microprocessor and the simulated clock delay in transferring the clock signal to the flip-flop on the sink side of the LSI circuit or microprocessor and the path delay. The total path delay coincides with a data transfer cycle of the LSI circuit or microprocessor.

When the total path delay is not within the reference transfer cycle of the microprocessor or LSI circuit, the driving ability of the clock amplifying gate at the last step clock amplifying gates is changed. Changing the driving ability of the last stage clock amplifying gate changes clock delay (faster switching) which in turn changes the total path delay. A delay violation found by delay checking after wiring lines have been arranged can be cancelled by changing the gate driving ability without using any delay gate and without changing the arrangement of the wiring lines.

BRIEF DESCRIPTION OF THE DRAWINGS

The present invention will be more apparent from the following detailed description, when taken in conjunction with the accompanying drawings, in which:

FIG. 7 is a schematic diagram illustrating an example of the clock distributing logic of the present invention.

DETAILED DESCRIPTION OF THE PREFERRED EMBODIMENTS

A clock skew control system and design method according to the present invention will be described hereinafter by referring to the accompanying drawings.

Figure 1:
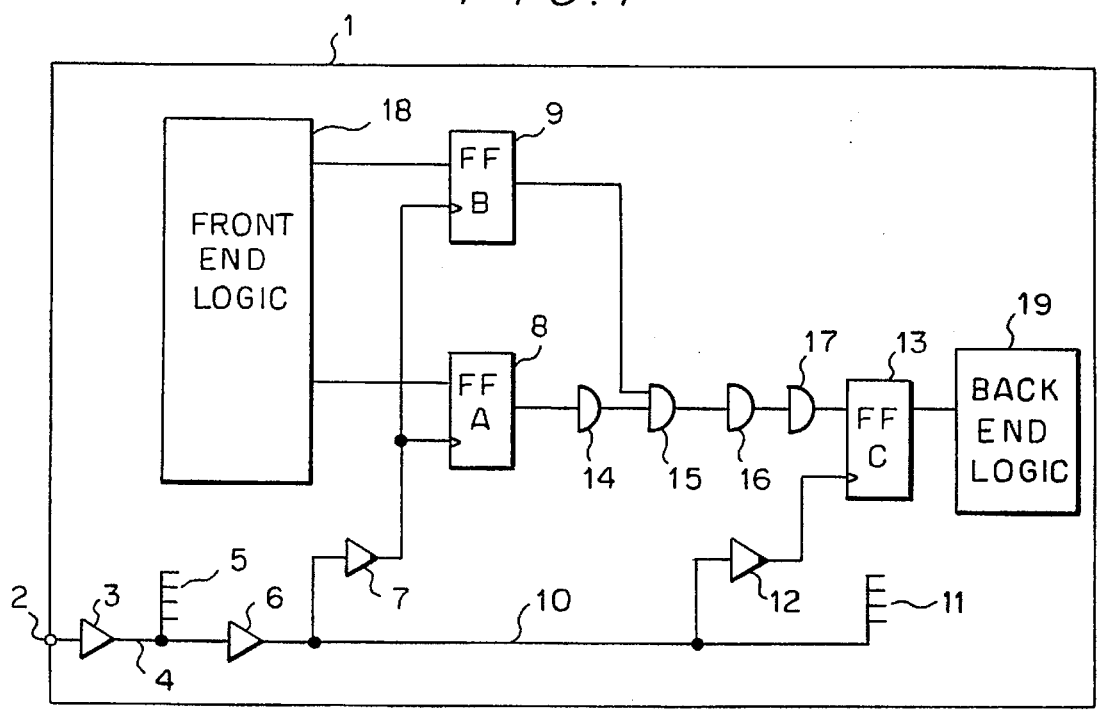
FIG. 1 illustrates a circuit incorporating clock distributing logic in accordance with the present invention.

FIG. 1 illustrates a circuit 1 incorporating the clock skew control system which includes clock distributing logic in accordance with the present invention. The circuit 1 may be an LSI circuit or a microprocessor. For illustration purposes only hereinafter the circuit 1 will be referred to as an LSI circuit.

The LSI circuit 1 includes a clock input pin 2, a clock signal input gate 3, a first-stage clock amplifying gate 6, a line 4 connecting the input gate 3 to the first-stage clock amplifying gate 6, another first-stage clock amplifying gate 5, not shown, last-stage clock amplifying gates 7 and 12, source-side flip-flops 8 and 9 driven by the last-stage clock amplifying gate 7, a sink-side flip-flop 13 driven by the last-stage clock amplifying gate 12, and logic gates 14, 15, 16 and 17 disposed between the flip-flops 8 and 13. The last-stage clock amplifying gates 7 and 12 and another last-stage clock amplifying gate 11 are driven by clock line 10 which is connected to first-stage clock amplifying gate 6. The first and last stage amplifying gates 5 and 6 and 7, 12 and 11, respectively, and the clock signal input gate 3 constitute clock distributing logic of the present invention. It should be noted that for the present example only two stages are shown. However, any number of stages can be provided so long as at least two stages are provided.

When a logical signal provided by the flip-flop 9 is given to the logic gate 15, a signal is given to the sink-side flip-flop 13 through the logic gates 16 and 17. The source-side flip-flops 9 and 8 receive logical signals provided by a front-end logic circuit 18. The output signal of the sink-side flip-flop 13 is given to a back-end logic circuit 19.

Figure 2:
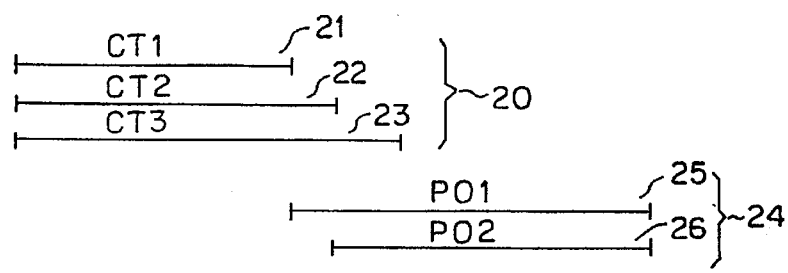
FIG. 2 is a timing diagram illustrating delays in distributing the clock signal to elements and along paths in the circuit show in FIG. 1.

Clock delays 20 illustrated in FIG. 2 are expressed by a time CT1 21 necessary for the input clock signal to be transferred from the clock input pin 2 to the clock input of the source-side flip-flop 8, a time CT2 22 necessary for the input clock signal to be transferred from the clock input pin 2 to the clock input of the source-side flip-flop 9, and a time CT3 23 necessary for the clock signal to be transferred from the clock input pin 2 to the clock input of the sink-side flip-flop 13. These clock delays are determined through delay simulation.

Path delays 24 also illustrated in FIG. 2 do not include clock skew and is attributable to a delay caused by the logic gates and the lines. The path delay 24 is expressed by a path delay PD1 25 between the source-side flip-flop 8 and the sink-side flip-flop 13 and a path delay PD2 26 between the source-side flip-flop 9 and the sink-side flip-flop 13. When calculating the path delay 24, gate and output delays in the source-side flip-flop, gate and output delays in the logic gates, and delays due to resistance, capacitance and noise in the wiring lines of the LSI circuit 1 are taken into account.

Figure 3:
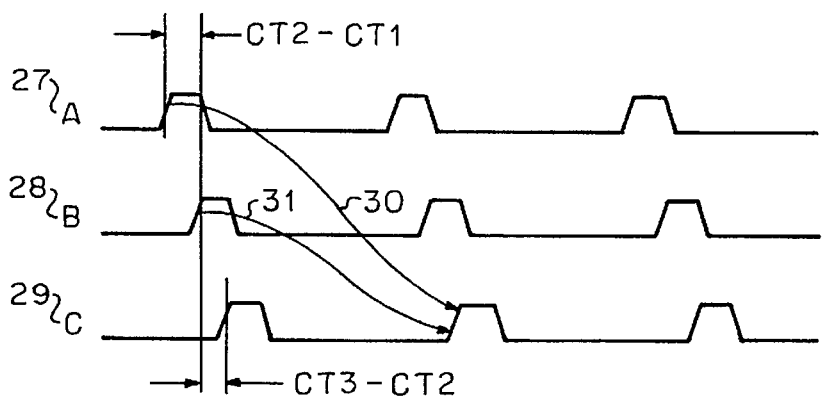
FIG. 3 is a timing diagram illustrating the timing at which clock signals are applied to elements in the circuit shown in FIG. 1.

In FIG. 3, indicated at A27 is an input clock signal to the source-side flip-flop 8, at B28 is an input clock signal to the source-side flip-flop 9, and at C29 is an input clock signal to the sink-side flip-flop 13.

Figure 4:
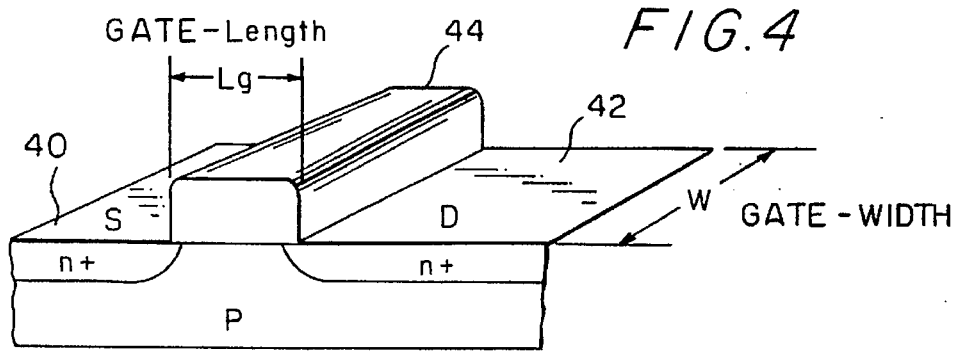
FIG. 4 is a schematic diagram illustrating a clock amplifying gate of a CMOS structure.

In the LSI circuit 1 incorporating the clock distributing logic of the present invention, the driving abilities of the last-stage clock amplifying gates 7, 11 and 12 can be changed in two or more steps. The driving abilities of the last-stage clock amplifying gates 7, 11 and 12 are controlled by, for example, the gate width (W size) for CMOS gates or the intensity of emitter follower current for ECL gates. The structure of a clock amplifying gate is illustrated in FIG. 4. As shown in FIG. 4 the clock amplifying gate includes a source 40, a drain 42 and a gate 44 which drives the clock amplifier gate to switch in response to a signal. The gate 44 has a length Lg and a width W. The width (size) of the gate in the clock amplifying gate effects its driving ability as illustrated in the graph shown in FIG. 5. As can be seen in the graph illustrated in FIG. 5 as the size of the gate increases the driving ability increases. In other words, switching occurs in a reduced amount of time.

The clock delays are times necessary for the clock signal to be transferred from the clock input pin 2 to the flip-flops 8, 9 and 13, respectively. For example, when the clock time CT2 22 necessary for the clock signal to be transferred from the clock input pin 2 to the clock input of the source-side flip-flop 9 is a reference time, the flip-flop 8 is driven by the clock signal at a time (CT2–CT1) before the flip-flop 9 is driven, and the flip-flop 13 is driven by the clock signal at a time (CT3–CT2) after the flip-flop 9 is driven. The deviation of the driving time from the reference clock delay is clock skew.

The conventional path delay design limits clock skew, i.e., the deviation of the driving time from the reference clock delay, to a value in a given range by inserting a delay gate in the circuit, adds the reference clock delay to the path delays, and examines each sum of the reference clock delay and the path delay to see if the sum is within the transfer cycle. Therefore, the transfer cycle increases when the reference clock skew is increased by the delay gate used for limiting the clock skew to a value within the given range and, consequently, the machine cycle cannot be increased.

In a data transfer mode 31 as shown in FIG. 3, the present invention uses a value obtained by subtracting the time (CT3–CT2) from a gate delay, i.e., a time necessary for transferring data from the source-side flip-flop 9 to the sink-side flip-flop 13, and the line delay PD2 26 as a data transfer cycle TC(31). In a data transfer mode 30, a value obtained by subtracting the sum of the time (CT2–CT1) and the time (CT3–CT2) from a gate delay, i.e., a time necessary for transferring data from the source-side flip-flop 8 to the sink-side flip-flop 13, and the line delay PD1 as a data transfer cycle TC(30). The data transfer mode 30, as compared with the data transfer mode 31, has a time allowance (CT2–CT1) in a transfer cycle including the clock driving times for the source-side flip-flop and the sink-side flip-flop.

In such a case, the driving ability of the last-stage clock amplifying gate 7 is reduced stepwise, whereby the phases of the clock signals A27 and B28 are delayed accordingly, and the phase of the clock signal C29 does not change when the driving ability of the last-stage clock amplifier 12 is kept unchanged. Consequently, the phases of the clock signals A27 and B28 approach the phase of the clock signal C29 by times corresponding to the phase delays and thereby clock skew is suppressed. The reduction of the driving ability of the last-stage clock amplifying gate 7 is stopped when the clock skew is reduced to the least possible extent and the driving ability in this state is employed as the driving ability of the clock amplifying gate to be incorporated into the LSI circuit.

That is, when the transfer cycles of the path delays PD1 25 and PD2 26 have allowances, the respective phases of the clock signal A27 applied to the source-side flip-flop 8 corresponding to the path delay PD1 25 and the clock signal B28 applied to the source-side flip-flop 9 corresponding to the path delay PD2 26 can be delayed by reducing the driving ability of the last-stage clock amplifying gate 7, so that the respective phases of the clock signals A27 and B28 approach the phase of the clock signal C29. Consequently, clock skew can be limited to a small value within the desired transfer cycle TTC.

Figure 6:
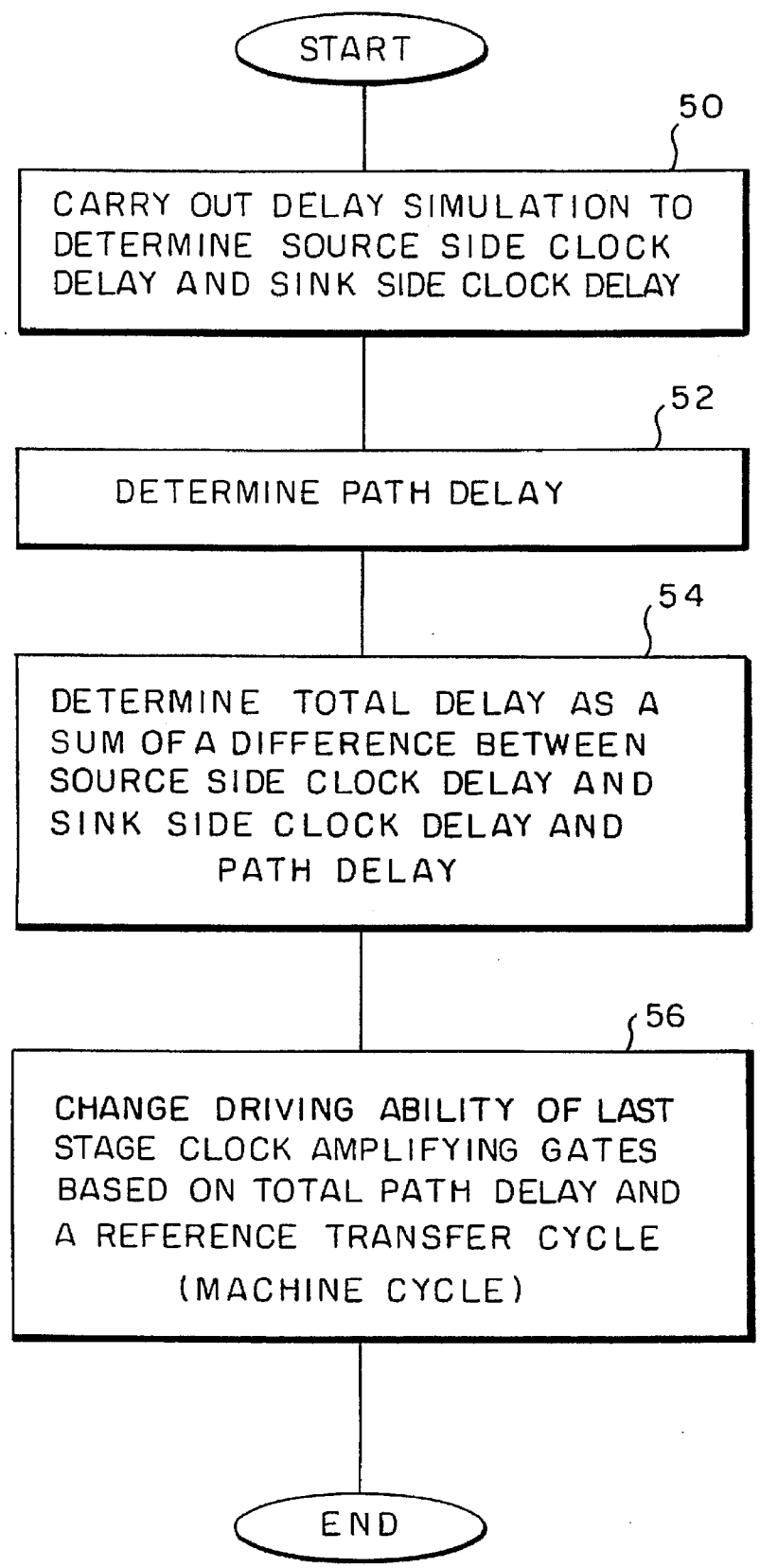
FIG. 6 is a flow chart illustrating the steps of the clock skew control design method of the present invention.

Thus, using the design method of the present invention as illustrated in FIG. 6 the delays in transferring the clock signals from the clock input pin through the clock distributing logic circuit for distributing the clock signals to the driving flip-flop are determined through delay simulation (step 50), the path delay in transferring the clock signal from the source-side flip-flop to the sink-side flip-flop is calculated (step 52), total path delay is calculated by determining the difference between the delay in transferring the clock signal from the clock input pin to the source-side flip-flop determined by clock delay simulation and the delay in transferring the clock signal from the clock input pin to the sink-side flip-flop determined by delay simulation and adding the difference to the path delay (step 54) and, when the total path delay is different than the reference transfer cycle, the driving ability of the last-stage clock amplifying gate is changed to make the total path delay coincide with the reference transfer cycle (step 56).

By using the design method of the present invention clock distributing logic for distributing a clock signal to the flip-flops in an LSI circuit is provided as illustrated, for example, in FIG. 7. The clock distributing logic of the present invention reduces clock skew which occurs during the distribution of the clock signal so that a delay in distribution of the clock signal coincides with a delay of a desired clock signal distributing cycle.

The clock distributing logic of the present invention includes at least two stages of clock amplifying gates 32 and 33 as illustrated in FIG. 7 for distributing the clock signal to flip-flops 34 of the LSI circuit. Each of the stages of clock amplifying gates 32 and 33 are successively connected to each other. Although only two stages are illustrated in FIG. 7 any number of stages, at least greater than or equal to two stages, may be provided.

In the present invention each stage of clock amplifying gates, namely clock amplifying gate 32, except the last stage of clock amplifying gates 33 includes clock amplifying gates of a same size. Thus, the same driving ability is provided for all clock amplifying gates other than clock amplifying gates in the last stage. The last stage of clock amplifying gates 33 includes clock amplifying gates of different sizes providing different driving abilities. The size of the clock amplifying gates of the last stage of clock amplifying gates 33 is set to cause the delay in distributing the clock signal to the flip-flops 34 in the LSI circuit to coincide with a delay in the desired clock signal distributing cycle.

Figure 5:
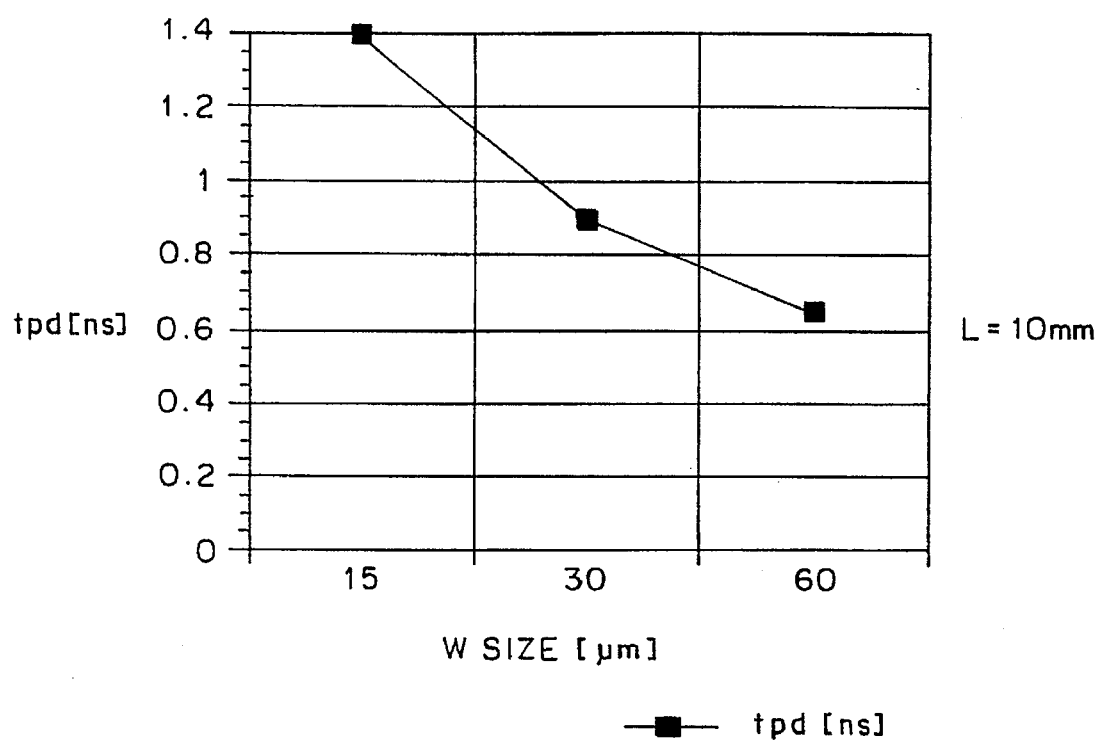
FIG. 5 is a graph illustrating the correlation between delay times and the width of a gate of a clock amplifying gate.

The size of the gates of the last stage clock amplifying gates are set according to, for example, the graph illustrated in FIG. 5. The driving ability of the clock amplifying gate is increased when the size of the gate is increased and decreased when the size of the gate is decreased. Increasing the driving ability of the clock amplifying gate reduces the amount of delay in distributing the clock signal and decreasing the driving ability increases the delay in distributing the clock signal. This increase or decrease in driving ability by adjusting the size of the gates of the last stage clock amplifying gates is controlled to effect the delay in distributing the clock signal in such a manner so that it coincides with the desired clock signal distributing cycle.

As described above, clock skew can be dealt with as part of the path delay by incorporating the clock distributing logic of the present invention in an LSI circuit so that an LSI circuit having low clock skew can be designed. Further, useless consumption of power can be eliminated in the LSI circuit by changing the driving ability of the last-stage clock amplifying gate.

A clock signal generated by an internal clock pulse generator may be used instead of the clock signal generated by an external clock pulse generator and applied to the clock input pin. When the internal clock pulse generator is used, the starting point of the clock delay simulation is the internal clock pulse generator. Changing the driving abilities of the clock amplifying gates at the other stages in addition to changing the driving ability of the last-stage clock amplifying gate enhances the accuracy of path delay control.

The clock distributing logic and clock skew control design method of the present invention do not use any devices for making a total path delay in transferring clock signals from the clock input to the flip-flops in an LSI circuit to coincide with a reference transfer cycle as in conventional systems. The present invention causes the total path delay in transferring clock signals from the clock input to flip-flops in an LSI circuit to coincide with the reference clock by changing the driving ability of the last clock amplifying gate. The total path delay as per the present invention is determined by subtracting the difference between the clock delay in transferring the clock signal from the clock input to the source-side flip-flop determined by simulation and the clock delay in transferring the clock signal from the clock input to the sink-side flip-flop determined by simulation and adding the difference to a path delay. By use of the present invention the data transfer cycle of the LSI circuit can be improved substantially.

Since the clock delay which in turn effects the total path delay is adjusted by changing the driving ability of the last-stage clock array amplifying gate, any additional clock amplifying gate for reducing clock skew, required for equal load distribution by the conventional system, and any additional length of clock lines for fine clock skew adjustment are not necessary.

Thus, in the present invention the gate wiring lines of the LSI circuit can be reduced. Furthermore, since the total path delay is adjusted to coincide with the reference transfer cycle by changing the driving ability of the last-stage clock amplifying gate, increasing the driving ability of the last-stage clock amplifying gate has the effect of reducing power consumption in the LSI circuit.

While the present invention has been described in detail and pictorially in the accompanying drawings it is not limited to such details since many changes and modifications recognizable to those of ordinary skill in the art may be made to the invention without departing from the spirit and the scope thereof.

What is claimed is:

1. A method of designing clock distributing logic such that said clock distributing logic reduces clock skew in a circuit by causing a delay in said clock distributing logic to coincide with a delay of a desired clock signal distributing cycle, said clock distributing logic operates in synchronism with a clock signal to distribute said clock signal applied to a clock input pin of said circuit through at least two stages of clock amplifying gates to flip-flops on source and sink sides of said circuit, said method comprising the steps of:

carrying out delay simulation by simulating a delay which occurs during transfer of said clock signal from said clock input pin through said clock distributing logic to a flip-flop, wherein said carrying out delay simulation step includes the steps of:

determining a source side clock delay representative of a delay which occurs during transfer of said clock signal from said clock input pin to said flip-flop on the source side of said circuit, and determining a sink side clock delay representative of a delay which occurs during transfer of said clock signal from said clock input pin to said flip-flop on the sink side of said circuit;

determining a path delay which occurs during transfer of said clock signal from said flip-flop on the source side of said circuit to said flip-flop on the sink side of said circuit;

determining a sum of a difference between said source side clock delay and said sink side clock delay and said path delay; and changing driving ability of each clock amplifying gate of a last stage of said at least two stages of clock amplifying gates based on said sum of said difference between said source and sink side clock delays, and said path delay and said delay of said desired clock signal distributing cycle.

2. A method of designing clock distributing logic according to claim 1 wherein said circuit is a LSI circuit.

3. A method of designing clock distributing logic according to claim 1 wherein said circuit is a microprocessor.

4. A method of designing clock distributing logic according to claim 1 wherein said sum of said difference between said source side clock delay and sink side clock delay, and said path delay is a total path delay and the driving ability of each clock amplifying gate of said last stage of said at least two stages of clock amplifying gates is changed until said total path delay coincides with said desired clock distributing cycle.

5. A method of designing clock distributing logic according to claim 1 wherein each clock amplifying gate of said last stage of said at least two stages of clock amplifying gates is a CMOS structure having a gate, source and drain and wherein said driving ability of said clock amplifying gate is changed by changing a width of said gate of said clock amplifying gate.

6. A method of designing clock distributing logic according to claim 5 wherein increasing the size of the width of the gate of the clock amplifying gate reduces delay and decreasing the size of the width of said gate of said clock amplifying gate causes a total path delay to increase.

7. A clock distributing logic for distributing a clock signal to flip-flops in a circuit, said clock signal applied to a clock input pin of the circuit, and reducing clock skew which occurs during distributing of said clock signal in said circuit so that a delay in the distributing of said clock signal coincides with a delay of a desired clock signal distributing cycle, comprising:

at least two stages of clock amplifying gates for distributing said clock signal to flip-flops on source and sink sides of said circuit, each of said at least two stages being successively connected to each other, wherein each of said at least two stages of clock amplifying gates except a last stage of clock amplifying gates includes clock amplifying gates of a same size providing a same driving ability, wherein said last stage of clock amplifying gates includes clock amplifying gates of different sizes providing different driving abilities, and wherein the size of each clock amplifying gate of said last stage of clock amplifying gates is set to cause the delay in distributing said clock signal to said flip-flops in said circuit to coincide with said delay in said desired clock signal distributing cycle.

8. A clock distributing logic according to claim 7 wherein said circuit is a LSI circuit.

9. A clock distributing logic according to claim 7 wherein said circuit is a microprocessor.

10. A clock distributing logic according to claim 7 wherein a sum of a difference between a source side clock delay and a sink side clock delay, and a path delay is a total path delay and the driving ability of each clock amplifying gate of said last stage of said at least two stages of clock amplifying gates is changed until said total path delay coincides with said desired clock distributing cycle.

11. A clock distributing logic according to claim 7 wherein each clock amplifying gate of said last stage of said at least two stages of clock amplifying gates is a CMOS structure having a gate, source and drain and wherein said driving ability of said clock amplifying gate is changed by changing a width of said gate of said clock amplifying gate.

12. A clock distributing logic according to claim 7 wherein increasing the size of the width of the gate of the clock amplifying gate reduces delay and decreasing the size of the width of said gate of said clock amplifying gate causes a total path delay to increase.

13. A method of designing clock distributing logic such that said clock distributing logic reduces clock skew during distributing a clock signal in a circuit, said method comprising the steps of:

carrying out delay simulation by simulating a delay which occurs during transfer of a clock signal from said clock input pin of said circuit through said clock distributing logic to determine a source side clock delay representative of a delay which occurs during transfer of said clock signal from said clock input pin to said source side of said circuit and a sink side clock delay representative of a delay which occurs during transfer of said clock signal from said clock input pin to said sink side of said circuit;

determining a path delay which occurs during transfer of said clock signal from said source side of said circuit to said sink side of said circuit;

determining a sum of a difference between said source side clock delay and said sink side clock delay and said path delay; and changing driving ability of each clock amplifying gate of a last stage of clock amplifying gates in said clock distributing logic based on said sum of said difference between said source and sink side clock delays, and said path delay and a desired clock signal distributing cycle.

14. A method of designing clock distributing logic according to claim 13 wherein said circuit is a LSI circuit.

15. A method of designing clock distributing logic according to claim 13, wherein said circuit is a microprocessor.

16. A method of designing clock distributing logic according to claim 13, wherein said sum of said difference between said source side clock delay and sink side clock delay, and said path delay is a total path delay and the driving ability of each clock amplifying gate of said last stage of said at least two stages of clock amplifying gates is changed until said total path delay coincides with said desired clock distributing cycle.

17. A method of designing clock distributing logic according to claim 13, wherein each clock amplifying gate of said last stage of said at least two stages of clock amplifying gates is a CMOS structure having a gate, source and drain and wherein said driving ability of said clock amplifying gate is changed by changing a width of said gate of said clock amplifying gate.

18. A method of designing clock distributing logic according to claim 13, wherein increasing the size of the width of the gate of the clock amplifying gate reduces delay and decreasing the size of the width of said gate of said clock amplifying gate causes a total path delay to increase.

19. A clock distributing logic for distributing a clock signal in a circuit and reducing clock skew which occurs during distributing of said clock signal to said circuit, comprising:

at least two stages of clock amplifying gates for distributing said clock signal to source and sink sides of said circuit, each of said at least two stages being successively connected to each other, wherein each of the at least two stages of clock amplifying gates except a last stage of clock amplifying gates includes clock amplifying gates of a same size providing a same driving ability, wherein said last stage of clock amplifying gates includes clock amplifying gates of different sizes providing different driving abilities, and wherein the size of each clock amplifying gate of said last stage of clock amplifying gates is set based on the delay in distributing said clock signal to said circuit and a desired clock signal distributing cycle.

20. A clock distributing logic according to claim 19 wherein said circuit is a LSI circuit.

21. A clock distributing logic according to claim 19 wherein said circuit is a microprocessor.

22. A clock distributing logic according to claim 19 wherein a sum of a difference between a source side clock delay and a sink side clock delay, and a path delay is a total path delay and the driving ability of each clock amplifying gate of said last stage of said at least two stages of clock amplifying gates is changed until said total path delay coincides with said desired clock distributing cycle.

23. A clock distributing logic according to claim 19 wherein each clock amplifying gate of said last stage of said at least two stages of clock amplifying gates is a CMOS structure having a gate, source and drain and wherein said driving ability of said clock amplifying gate is changed by changing a width of said gate of said clock amplifying gate.

24. A clock distributing logic according to claim 19 wherein increasing the size of the width of the gate of the clock amplifying gate reduces delay and decreasing the size of the width of said gate of said clock amplifying gate causes a total path delay to increase.

* * * * *